(12) United States Patent
Kobayashi

(10) Patent No.: US 7,274,423 B2
(45) Date of Patent: Sep. 25, 2007

(54) ELECTRO-OPTICAL APPARATUS HAVING A LIGHT-EMITTING ELEMENT, MANUFACTURING METHOD THEREOF, AND ELECTRONIC INSTRUMENT

(75) Inventor: Hidekazu Kobayashi, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/095,566

(22) Filed: Apr. 1, 2005

(65) Prior Publication Data

US 2005/0181235 A1  Aug. 18, 2005

Related U.S. Application Data

(63) Continuation of application No. 10/283,070, filed on Oct. 30, 2002, now Pat. No. 6,882,400.

(30) Foreign Application Priority Data

Oct. 30, 2001 (JP) .............................. 2001-332920

(51) Int. Cl.
*G02F 1/1339* (2006.01)
*H01J 1/62* (2006.01)

(52) U.S. Cl. ...................... 349/153; 313/512

(58) Field of Classification Search .............. 349/96, 349/117, 123, 138, 153, 190; 313/504, 506–512; 359/485, 495
See application file for complete search history.

(56) References Cited

U.S. PATENT DOCUMENTS

| 4,845,405 A | 7/1989 | Yamane et al. ............. 313/500 |
| 5,652,067 A * | 7/1997 | Ito et al. ...................... 428/690 |
| 5,757,126 A * | 5/1998 | Harvey et al. .............. 313/506 |
| 5,928,801 A | 7/1999 | Broer et al. ................. 349/69 |
| 5,952,778 A | 9/1999 | Haskal et al. .............. 313/504 |
| 6,150,187 A * | 11/2000 | Zyung et al. ................ 438/26 |
| 6,198,217 B1* | 3/2001 | Suzuki et al. .............. 313/504 |
| 6,211,613 B1 | 4/2001 | May .......................... 313/504 |
| 6,268,695 B1 | 7/2001 | Affinito ..................... 313/504 |
| 6,433,487 B1 | 8/2002 | Yamazaki ................. 315/169.3 |
| 6,570,325 B2 | 5/2003 | Graff et al. ................. 313/506 |
| 6,720,203 B2* | 4/2004 | Carcia et al. ................ 438/99 |
| 6,864,629 B2* | 3/2005 | Miyaguchi et al. ......... 313/512 |
| 6,923,702 B2* | 8/2005 | Graff et al. .................. 445/24 |
| 2002/0060772 A1 | 5/2002 | Umemoto et al. ......... 349/158 |
| 2002/0093284 A1 | 7/2002 | Adachi et al. ............. 313/506 |
| 2003/0164677 A1* | 9/2003 | Miyaguchi et al. ......... 313/504 |

FOREIGN PATENT DOCUMENTS

| EP | 0 949 850 A1 | 10/1999 |
| EP | 1 223 618 A2 | 7/2002 |
| JP | A 07-192866 | 7/1995 |
| JP | A 09-127885 | 5/1997 |
| JP | A 11-45058 | 2/1999 |
| WO | WO 00/65385 | 11/2000 |

* cited by examiner

*Primary Examiner*—Dung T. Nguyen
(74) *Attorney, Agent, or Firm*—Oliff & Berridge, PLC

(57) ABSTRACT

The invention reduces or suppresses outside light reflection without reducing or substantially reducing the light emitting strength from a light-emitting element. An apparatus of the invention includes a light-emitting element. A wavelength correcting unit, a planar polarization beam splitter, and a polarizing plate are also included.

14 Claims, 4 Drawing Sheets

[Fig. 1]
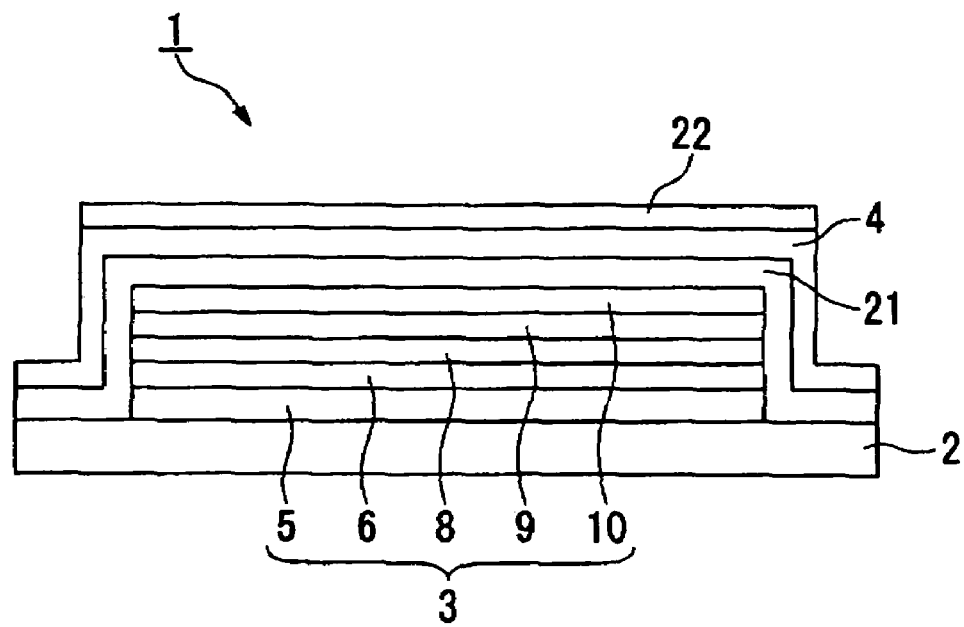
[Fig. 2]
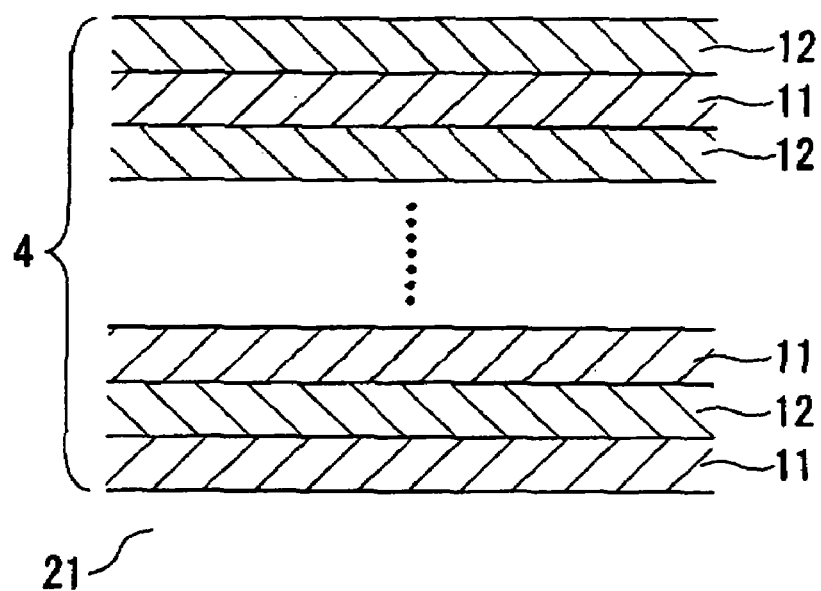

[Fig. 3]
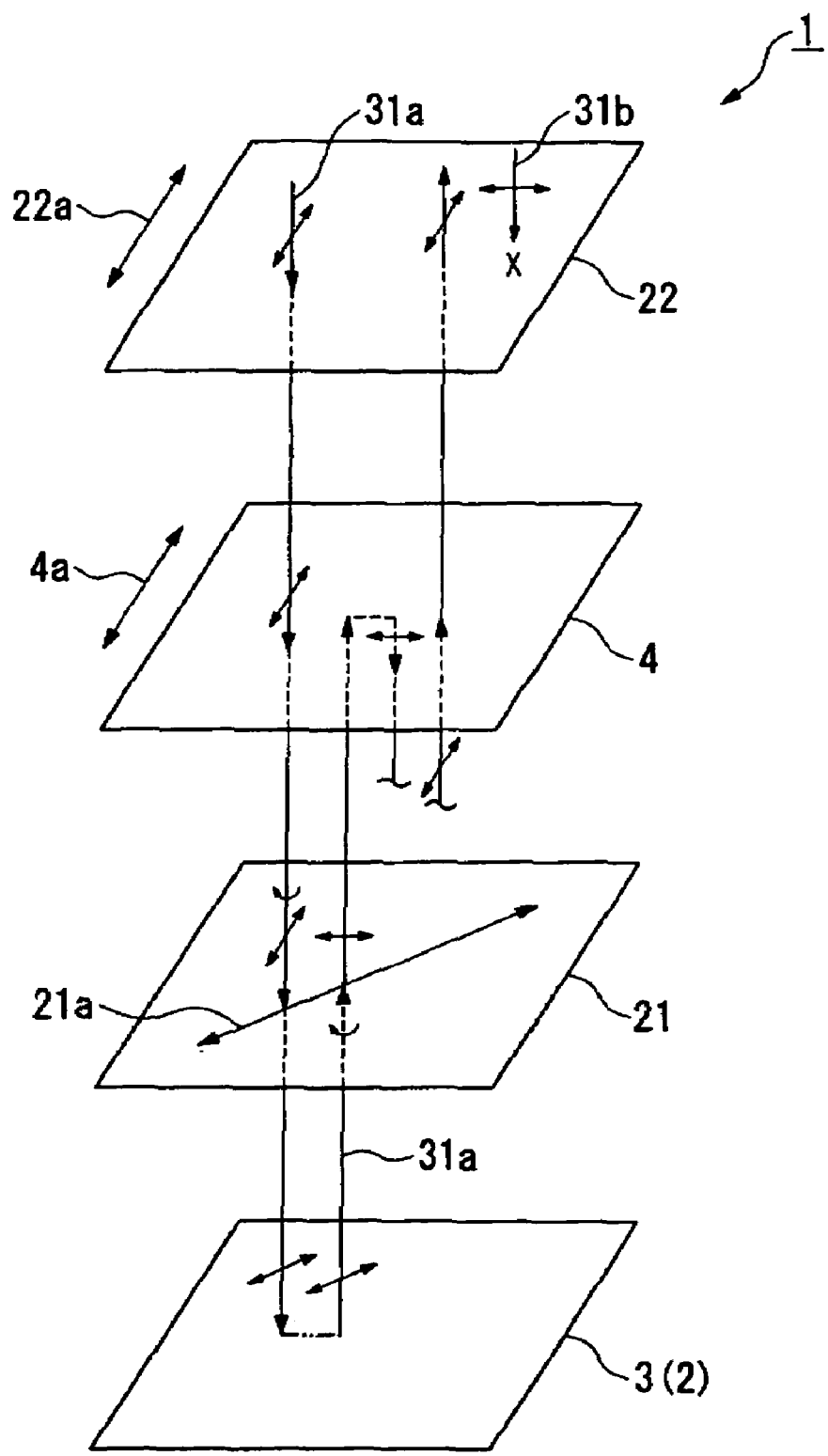

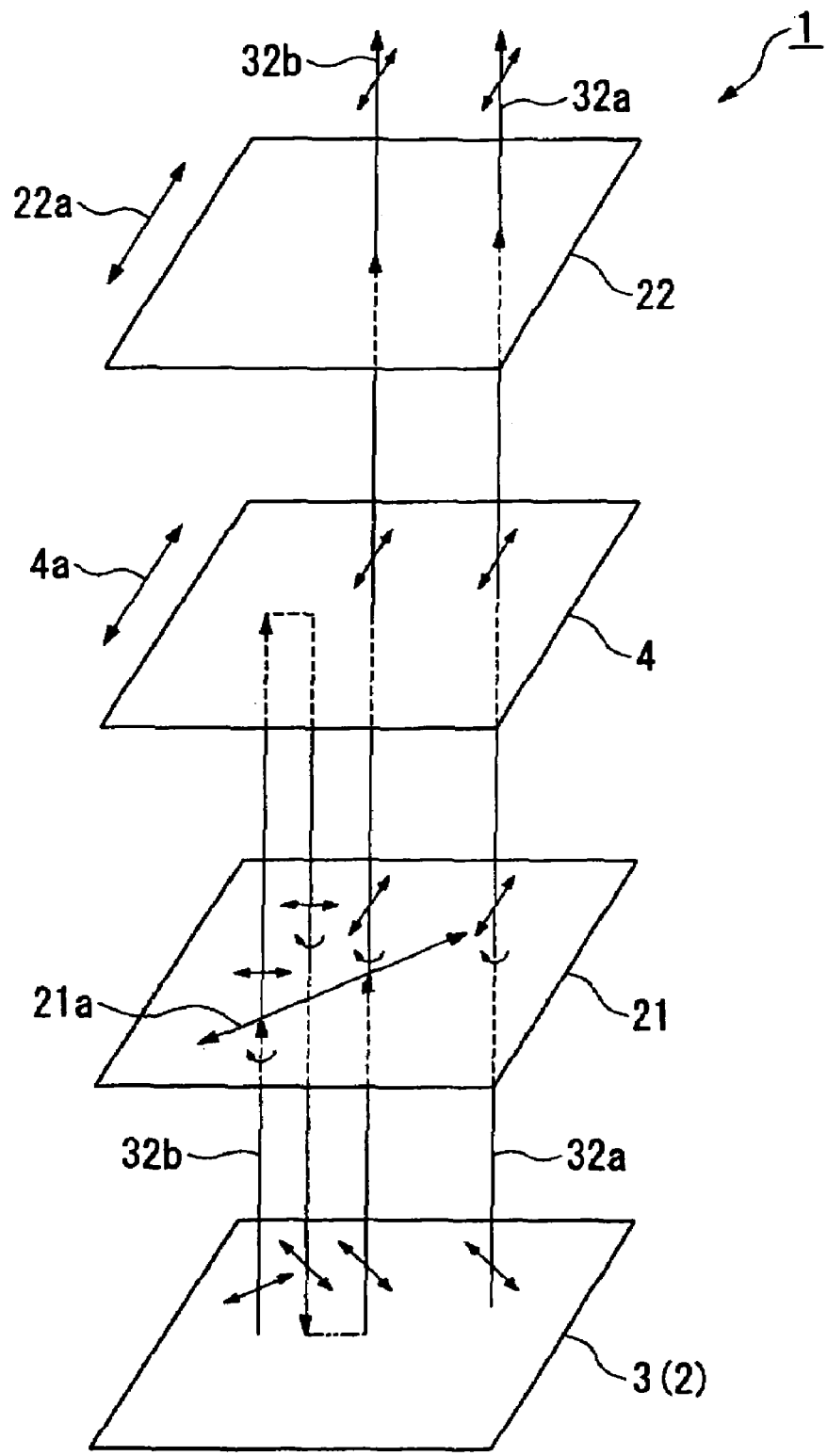
[Fig. 4]

[Fig. 5]
(a)
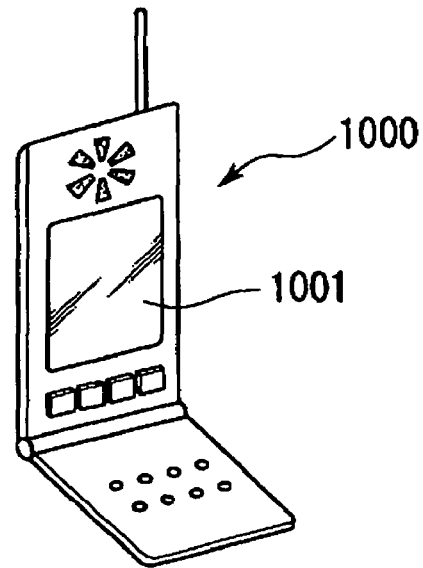
(b)
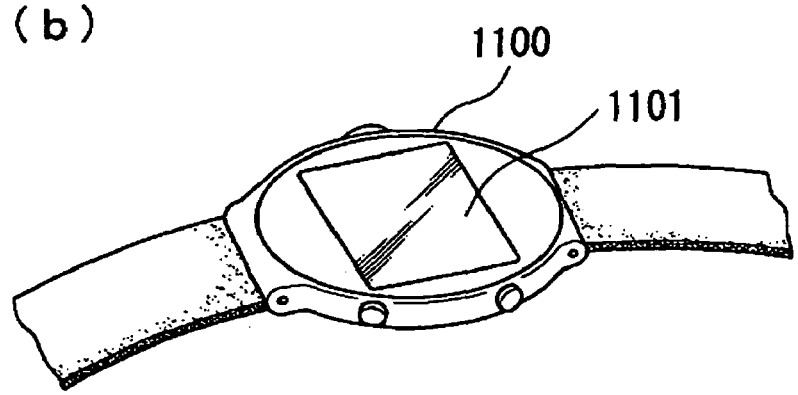
(c)
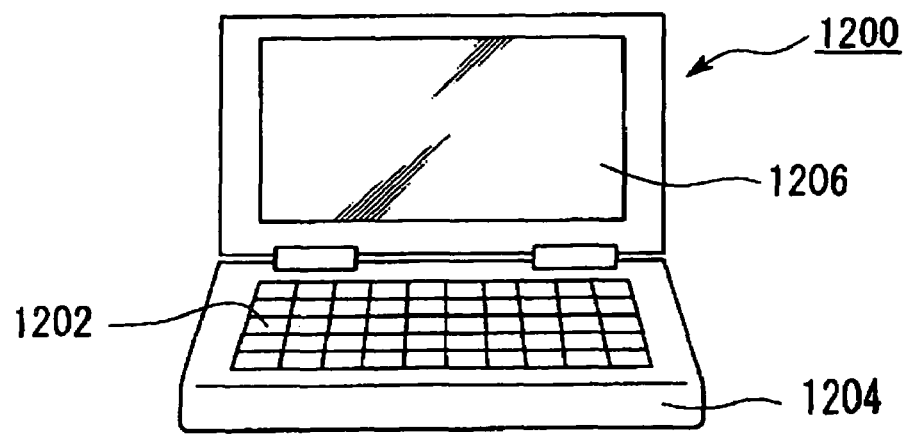

ELECTRO-OPTICAL APPARATUS HAVING A LIGHT-EMITTING ELEMENT, MANUFACTURING METHOD THEREOF, AND ELECTRONIC INSTRUMENT

CROSS REFERENCE TO RELATED APPLICATIONS

This is a Continuation of U.S. patent application Ser. No. 10/283,070 filed Oct. 30, 2002 now U.S. Pat. No. 6,882,400. The entire disclosure of the prior application is hereby incorporated by reference herein in its entirety.

BACKGROUND OF THE INVENTION

1. Field of Invention

The present invention relates to an electro-optical apparatus, a manufacturing method thereof, and an electronic instrument having the electro-optical apparatus. More specifically, the invention relates to an electro-optical apparatus having a light-emitting element, such as an organic EL apparatus, a manufacturing method thereof, and an electronic instrument having the electro-optical apparatus.

2. Description of Related Art

A related art electro-optical apparatus, such as a liquid crystal apparatus and an organic EL (electroluminescence) apparatus, may have an arrangement in that a plurality of circuit elements, electrodes, liquid crystal elements, or EL elements, are deposited on a substrate. For example, the organic EL apparatus has a light-emitting element containing a light-emitting substance that is sandwiched by electrode layers formed of an anode and a cathode, so that it utilizes a light-emitting phenomena of positive holes injected from the anode side and electrons injected from the cathode side, which are rejoined together in a fluorescence-emittable light-emitting layer so as to be inactivated from an excited state.

In one type of such organic EL apparatuses, in which light is emitted by the emission of the light-emitting element from the side opposite to the substrate, outside light that is incident in an EL panel is reflected by the light-emitting element so as to become reflected light, so that the contrast of the light-emitting element may be reduced having an adverse affect on visibility.

Therefore, in order to address or prevent such a problem, a quarter wave plate and a circularly polarizing plate are provided on the surface of the EL panel as wavelength correcting plates.

In this structure, one half of the outside light is blocked by the polarizing plate and the other half of the light passes through the polarizing plate and is aligned with a polarization axis of the polarizing plate. The outside light transmitted through the polarizing plate is reflected by the light-emitting element so as to approach the polarizing plate again, and is absorbed in the polarizing plate as the polarization axis is twisted at an angle of 90° by transmitting the quarter wave plate two times, so that almost all of the outside-light reflection due to the outside light is consequently reduced or suppressed.

SUMMARY OF THE INVENTION

Such a related art electro-optical apparatus as discussed above, however, is subject to the following problem.

Although the outside-light reflection can be substantially reduced or suppressed, because one half of the emitted light from the light-emitting element is also absorbed in the polarizing plate, a problem arises in that a display becomes darkened since the light-emitting strength from the inside is reduced.

The present invention addresses the problems mentioned above, and provides an electro-optical apparatus capable of reducing or suppressing outside-light reflection without reducing the light-emitting strength from a light-emitting element. The invention also provides a manufacturing method thereof, and an electronic instrument having the electro-optical apparatus.

In order to address or achieve the above, the present invention may adopt the following exemplary arrangements.

An electro-optical apparatus according to the present invention includes a light-emitting element. A wavelength correcting unit, a planar polarization beam splitter, and a polarizing plate are arranged.

Therefore, according to the present invention, one polarized element of the light incident from the opposite of the substrate is effectively absorbed by the polarizing plate, enabling the reflected light to be halved. On the other hand, one half or approximately one half of the polarized element of the light produced in the light-emitting layer passes through the planar polarization beam splitter and the absorption-type polarizing plate so as to be directly emitted in the front, while the other half or substantially the other half of the polarized element is reflected by the planar polarization beam splitter, and the polarizing direction is twisted at an angle of 90° by the wavelength correcting layer and a metallic electrode, for example, of the light-emitting element, so that the polarized element enters the planar polarization beam splitter again so as to be emitted in the front. Accordingly, all of the light or substantially all of the light produced in the light-emitting layer can be emitted in the front, preventing or substantially preventing the reduction in the light-emitting strength. Therefore, all of the light or substantially all of the light produced by the light-emitting element can be emitted in a state that the outside light is reduced or suppressed to be half or less, enabling the visibility to be enhanced.

According to the present invention, the planar polarization beam splitter may include a sealing layer to hermetically seal the light-emitting element.

Thereby, according to the present invention, the light-emitting element may be hermetically sealed so that the degradation of the light-emitting element due to the oxidation of a material of the element can be reduced or suppressed, enabling defects due to the element degradation, which are instability with time and a short life span, to be reduced or suppressed.

According to the present invention, the sealing layer may be formed of a plurality of layers by alternately laying up an inorganic compound layer having an isotropic refractive index, on which a rubbing treatment is performed in a predetermined direction, and an organic compound layer having an anisotropic refractive index.

Thereby, according to the present invention, incident light may be divided into two light rays linearly polarized in a perpendicular direction relative to each other, or two circularly polarized light rays with a rotating direction opposite to each other, according to a rubbing direction and a polarized element of light. Also, the inorganic layer may include a gas barrier layer for the light-emitting element while the organic layer may include an insulating layer between the gas barrier layer and the light-emitting element.

According to the present invention, the rubbing directions in the laid layers, each having the isotropic refractive index, of the planar polarization beam splitter are the same.

Thereby, according to the present invention, incident light can be divided into reflected light and transmitted light according to the rubbing direction and the polarized element of light.

According to the present invention, the wavelength correcting unit may be formed by laying up a plurality of liquid crystalline compound layers, in each of which chiral dopant is orientated in a predetermined direction, so that the chiral dopant orientating direction of each layer is displaced by a predetermined angle from each other.

Thereby, according to the present invention, a quarter wave plate, for example, may be arranged according to the displacement of the chiral dopant orientation.

On a surface of the polarizing plate, at least one of nonglaring treatment and reflection-reducing treatment may be performed.

Thereby, according to the present invention, the outside light reflection due to outside light can be reduced or suppressed, enhancing contrast.

An electronic instrument according to the present invention includes the electro-optical apparatus described above.

Thereby, according to the present invention, an electronic instrument with a bright display can be obtained, in which outside light reflection is reduced or suppressed without reducing the light-emitting strength from the light-emitting element.

On the other hand, a manufacturing method of an electro-optical apparatus that includes a light-emitting element according to the present invention includes: arranging a wavelength correcting unit, arranging a planar polarization beam splitter, and arranging a polarizing plate.

Thereby, according to the present invention, one polarized element of the light incident from the opposite side of the substrate is effectively absorbed by the polarizing plate, enabling the reflected light to be halved or substantially halved. On the other hand, one half of the polarized element of the light produced in the light-emitting layer passes through the planar polarization beam splitter and the absorption-type polarizing plate so as to be directly emitted in the front, while the other half of the polarized element is reflected by the planar polarization beam splitter, and the polarizing direction is twisted at an angle of 90° by the wavelength correcting layer and a metallic electrode, for example, of the light-emitting element, so that the polarized element enters the planar polarization beam splitter again so as to be emitted in the front. Accordingly, all or substantially all of the light produced in the light-emitting layer can be emitted in the front, preventing or substantially preventing the reduction in the light-emitting strength. Therefore, all or substantially all of the light produced by the light-emitting element can be emitted in a state that the outside light is suppressed to be half or less, enabling the visibility to be enhanced.

Also, the present invention may include forming a sealing layer to hermetically seal the light-emitting element with the planar polarization beam splitter.

Thereby, according to the present invention, the light-emitting element may be hermetically sealed so that the degradation of the light-emitting element due to the oxidation of a material of the element can be reduced or suppressed, enabling defects due to the element degradation, which are instability with time and a short life span, to be reduced or suppressed.

In the present invention, the forming the sealing layer may also include forming a plurality of layers by alternately laying up an inorganic compound layer having an isotropic refractive index, on which a rubbing treatment is performed in a predetermined direction, and an organic compound layer having an anisotropic refractive index.

Thereby, according to the present invention, incident light may be divided into two light rays that are linearly polarized in a perpendicular direction relative to each other, or two circularly polarized light rays with a rotating direction opposite to each other, according to a rubbing direction and a polarized element of light. Also, the inorganic layer may include a gas barrier layer for the light-emitting element, while the organic layer may include an insulating layer between the gas barrier layer and the light-emitting element.

According to the present invention, the planar polarization beam splitter may be formed by laying up layers, each having the isotropic refractive index, so that the rubbing directions are substantially the same.

Thereby, according to the present invention, incident light can be divided into reflected light and transmitted light according to the rubbing direction and the polarized element of the light.

According to the present invention, the wavelength correcting unit may be formed by laying up a plurality of liquid crystalline organic compound layers, in each of which chiral dopant is orientated in a predetermined direction, so that the chiral dopant orientating direction of each layer is displaced by a predetermined angle from each other.

Thereby, according to the present invention, a quarter wave plate, for example, may be arranged according to the displacement of the chiral dopant orientation.

The present invention may also include performing at least one of nonglaring treatment and reflection-reducing treatment on a surface of the polarizing plate.

Thereby, according to the present invention, the outside light reflection due to outside light can be reduced or suppressed, enhancing contrast.

BRIEF DESCRIPTION OF THE DRAWINGS

FIG. 1 is a schematic sectional view of an organic EL apparatus having a light-emitting element, wavelength correcting layer, polarization beam splitter, and polarizing plate formed on a substrate, showing an embodiment of the present invention;

FIG. 2 is an enlarged schematic showing an arrangement of the polarization beam splitter;

FIG. 3 is a schematic showing a light path of a polarized element of outside light;

FIG. 4 is a schematic showing a light path of a polarized element of light of the light-emitting element;

FIGS. 5(a)-5(c) are perspective views showing examples of electronic instruments having the organic EL apparatus, and particularly show a mobile phone, a watch-type electronic instrument, and a portable information processing apparatus, respectively.

DETAILED DESCRIPTION OF PREFERRED EMBODIMENTS

Exemplary embodiments of an electro-optical apparatus, a manufacturing method thereof, and an electronic instrument according to the present invention are described below with reference to FIGS. 1 to 5(c). In this description, the electro-optical apparatus according to the present invention is exemplified by an organic EL apparatus.

An organic EL apparatus (electro-optical apparatus) 1 shown in FIG. 1 includes a substrate 2, a light-emitting element 3 formed on the substrate 2, a wavelength correcting layer (wavelength correcting unit) 21, a sealing layer 4 to hermetically seal the light-emitting element 3, an absorption-type polarizing plate 22, which are sequentially formed on the light-emitting element 3 opposite to the substrate 2 in that order.

The substrate 2 can be formed of plastics, such as polyolefins, polyesters, polyacrylate, polycarbonate, polyethersulfone, and polyetherketone, and transparent materials, such as glass, for example. According to the embodiment, the glass is used.

The light-emitting element 3 substantially includes an anode 5 formed on the substrate 2, a hole-transporting layer 6, an organic light-emitting layer 8, an electron-transporting layer 9, and a cathode 10. Although not shown in FIG. 1, an insulating layer is formed on the anode 5 so as to expose a surface thereof joining to the hole-transporting layer 6.

The anode 5 can be formed of elemental substances, such as aluminum (Al), gold (Au), silver (Ag), magnesium (Mg), nickel (Ni), zinc-vanadium (Zn-V), indium (In), and tin (Sn); a compound or mixture of these elemental substances; and a conductive adhesive containing a metallic filler, for example. According to the embodiment, ITO (indium tin oxide) is used. The anode 5 is preferably formed by sputtering, ion plating, or vacuum deposition. It may also be formed by printing with a spin coater, gravure coater, or knife coater; screen printing; or flexography. In addition, the anode 5 may be formed of light-transmissive (transparent) materials which are shown. Alternatively, reflective materials may be used. More particularly, at least one of the substrate 2 and the anode 5 may have reflectiveness.

The hole-transporting layer 6 may be formed by co-depositing a carbazole polymer and a TPD (triphenyl compound) so as to have a film thickness in the range of 10 nm to 1000 nm (100 nm to 700 nm, more preferably), for example. As an alternative process, the hole-transporting layer 6 may be formed on the anode 5 by drying and heating treatments after positive-hole injecting and ejecting an ink composition containing a transporting material onto the anode 5 by an inkjet method, for example. A mixture of a polythiophenic derivative, such as polyethylenedioxythiophene and polystyrenesulfonic acid, may be used as the ink composition by dissolving it into a polar solvent, such as water.

The insulating film may be patterned using a photolithographic and an etching technology after depositing $SiO_2$ on the entire surface of the substrate by a CVD method.

The organic light-emitting layer 8, as with the hole-transporting layer 6, may be formed on the hole-transporting layer 6 by drying and heating treatments after ejecting an ink composition containing a light-emitting layer material onto the hole-transporting layer 6 by an inkjet method. Light-emitting materials for use in the organic light-emitting layer 8 may include a fluorenyl polymer derivative, a (poly) paraphenylenevinylene derivative, a polyphenylene derivative, a polyfluorene derivative, polyvinylcarbazole, a polythiophene derivative, perylene coloring matter, coumarin coloring matter, Rhodamine coloring matter, other low-molecular-weight organic EL materials soluble in a benzene derivative, and a polymer organic EL material.

Also, the electron-transporting layer 9 may be formed by evaporating and depositing a metallic complex compound made from a metal and organic ligand, which are preferably Alq3(tris(8-quinolinolate)aluminum complex), Znq2(bis(8-quinolinolate)zinc complex), Bebq2(bis(8-quinolinolate) berilium complex), Zn-BTZ(2-(o-hydroxyphenyl)benzothiazolezinc), and a perylene derivative so as to have a film thickness in the range of 10 nm to 1000 nm (100 nm to 700 nm, more preferably).

The cathode 10 is constructed by depositing an upper (toward the sealing layer) cathode layer on a lower (toward the substrate) cathode layer. The lower cathode layer may be made from a metal having a work function that is lower than that of the upper cathode layer, such as calcium, so as to be efficiently injectable electrons into the electron-transporting layer 9. The upper cathode layer protects the lower cathode layer and may preferably be made from a substance having a work function that is relatively larger than that of the lower cathode layer, such as aluminum. These upper and lower cathode layers may preferably be formed by a vacuum deposition method, a sputtering method, and a CVD method. It is especially preferable to be formed by the vacuum deposition method in terms of protecting the organic light-emitting layer 8 from damage due to heat, ultra-violet rays, an electron beam, and plasma.

Although not shown, the organic EL apparatus according to the embodiment is an active matrix type, in practice, in which a plurality of data lines and a plurality of scanning lines are arranged in a lattice, and to each of pixels that are defined by the data lines and the scanning lines and arrayed in a matrix arrangement, the light-emitting element 3 is connected via a driving TFT, such as a switching transistor and a driving transistor. When a driving signal is supplied via the data line or scanning line, a current passes through between electrodes, so that the light-emitting element 3 emits light toward the reverse of the substrate 2 (toward the sealing layer 4) so as to turn on the pixel.

The wavelength correcting layer 21 is formed by laying up layers, that are each made from a liquid crystalline organic compound with a thickness of about 5 μm, on which a rubbing treatment is performed and chiral dopant is added, so that the rubbing orientational direction of each layer is deviated by 90° from each other, so as to have a predetermined thickness. By the wavelength correcting layer 21 with ultra-violet rays so as to solidify it, the wavelength correcting layer 21 serves the same function as that of a quarter wave plate twisting the polarizing direction of incident light by 45°. A liquid crystalline acrylate monomer and a liquid crystalline polymer may be used as the liquid crystalline organic compound.

The sealing layer 4, as shown in FIG. 2, is fabricated on the light-emitting element 3 by alternately laying up an inorganic layer 11, on which a rubbing treatment is performed in a specific direction and which covers the light-emitting element 3 with the wavelength correcting layer 21 therebetween, and an organic layer 12 formed on the inorganic layer 11, so as to have a plurality of layers (several dozens to several hundreds layers). In the sealing layer 4, the plurality of inorganic layers 11 are fabricated so as align the rubbing directions, and thereby a polarized element corresponding to the rubbing direction of light incident in the sealing layer 4 is transmitted while the other half polarized element is reflected so as to configure a planar polarization beam splitter (referred to as a polarization beam splitter 4 for convenience sake). The polarization axes of the wavelength correcting layer 21 and the polarization beam splitter 4 are arranged to make an angle of 45°. As the inorganic layer 11, it is preferable to use a light-transmissive material having gas-barrier properties for the light-emitting element 3 and an isotropic refractive index (ceramics such as silicon nitride; $Si_3N_4$, for example). As the organic layer 12, it is preferable to use a light-transmissive material having an anisotropic refractive index in a specific direction (the above-mentioned liquid crystalline organic compound, for example). Wherein the glass transition temperature of the material of the inorganic layer 11 is Tg and the temperature at which the material of the organic layer 12 produces a liquid crystalline layer is $T_{LC}$, these materials are selected to satisfy the relationship of $Tg>T_{LC}$.

When the forming process of the sealing layer 4 is simply described, first, the inorganic layer 11 is formed by a sputtering method and CVD method, etc., on the light-emitting element 3 on the substrate 2 having the wavelength correcting layer 21, and then the rubbing treatment is performed on the inorganic layer 11 in a predetermined direction (A). Next, a material of the organic layer 12 is applied on the rubbing-treated inorganic layer 11 and heated (B). The heating temperature T at this time is set to satisfy that $Tg>T>T_{LC}$, so that the organic layer 12 becomes a liquid crystal layer, while the inorganic layer 11 maintains a crystalline state without becoming a glass state. By repeating the processes (A) and (B) multiple times, the sealing layer (polarization beam splitter) 4 can be formed, in which the inorganic layers 11 and the organic layers 12 are alternately laid up.

The absorption-type polarizing plate 22 is wrapped over the polarization beam splitter 4 while aligning the polarization direction of the transmitted light, so that one polarized light passes through the polarizing plate 22 and polarization beam splitter 4. In practice, it is preferable that the polarization axis be aligned by rotating the polarizing plate 22 so that the light-emitting strength of the light-emitting element 3 is maximized. Referring to FIG. 1, on the top surface of the polarizing plate 22 (opposite to the polarization beam splitter 4, i.e., toward the outside light), reflection-reducing coating (reflection-reducing treatment) is applied.

Consequently, the effect of the organic EL apparatus 1 arranged as described above is described with reference to FIGS. 3 and 4. FIG. 3 is a schematic showing a light path of the polarized element of outside light, and FIG. 4 is a schematic showing a light path of the polarized element of the light emitted from the light-emitting element 3. In FIGS. 3 and 4, the polarizing plate 22, the polarization beam splitter 4, the wavelength correcting layer 21, and the light-emitting element 3 are shown in simplified forms for convenience. Arrows 22a, 4a, and 21a show polarizing axes of the polarizing plate 22, the polarization beam splitter 4, and the wavelength correcting layer 21, respectively.

As shown in FIG. 3, one half of the polarized element 31a of outside light, in which the polarizing direction is aligned with a polarizing axis 22a of the polarizing plate 22, passes through the polarization beam splitter 4 and is reflected by the light-emitting element 3 (an aluminum reflection film of the substrate 2 according to the embodiment) after transmitting the wavelength correcting layer 21. Then, by passing through the wavelength correcting layer 21 again, the polarizing direction thereof is twisted by 90°.

Thereby, the light is reflected by the polarization beam splitter 4, and the reflected light passes through the wavelength correcting layer 21 two times again, so that the polarizing direction of the reflected light is twisted by 90°, and the reflected light passes through the polarization beam splitter 4 and the polarizing plate 22 to be emitted toward the front as outside reflection. The other half of the polarized element 31b is absorbed without transmitting the polarizing plate 22. Therefore, in the organic EL apparatus 1, the outside reflection can be halved.

On the other hand, as shown in FIG. 4, one half of the polarized element 32a in the light produced in the light-emitting element 3 passes through a polarizing axis 4a of the polarization beam splitter 4 and the polarizing plate 22 to be emitted in the front, because by transmitting the wavelength correcting layer 21 so that the polarizing direction is twisted by 45°, the polarizing direction of the polarizing axis 4a of the polarization beam splitter 4 is aligned with the polarizing axis 22a of the polarizing plate 22. The other half polarized element 32b is reflected by the polarization beam splitter 4; passes through the wavelength correcting layer 21; is reflected by the light-emitting element 3 (the aluminum reflection film of the substrate 2 according to the embodiment); and passes through the wavelength correcting layer 21 again so that the polarizing direction is twisted by 90°. Therefore, the polarized element 32b passes through the polarizing axis 4a of the polarization beam splitter 4 and the polarizing plate 22 to be emitted in the front, because the polarizing direction of a polarizing axis 4a of the polarization beam splitter 4 is aligned with the polarizing axis 22a of the polarizing plate 22. That is, all or substantially all of the light produced in the light-emitting element 3 is emitted in the front without or substantially without or substantially without decreasing the light emitting strength.

As described above, according to the embodiment, even in a type of organic EL apparatus in that light is derived from the electrode of the substrate, by arranging the polarizing plate 22, the polarization beam splitter 4, and the wavelength correcting layer 21, a reduction in the light-emitting strength can be prevented or substantially prevented while the outside light reflection is reduced or suppressed to be half, so that the problem that a display becomes darkened can be solved or substantially solved, enhancing visibility. Also, according to the embodiment, the coating to reduce enhancing reflection is performed on the polarizing plate 22, so that the outside light reflection can be further suppressed, enabling the visibility even in a bright place to be further enhanced. In addition, performing nongraring treatment on the polarizing plate 22 enables the display to be further conspicuous, because the scene reflected thereon is reduced.

Also, according to the embodiment, since the sealing layer to seal the light-emitting element 3 constitutes the polarization beam splitter 4, the degradation of the light-emitting element due to the oxidation of a material of the light-emitting element can be reduced or restrained, enabling defects due to the element degradation, which are instability with time and a short life span, to be reduced or suppressed. Furthermore, the steps of forming the polarization beam splitter and the sealing layer need not be arranged individually, enhancing production efficiency.

Next, examples of an electronic instrument having the organic EL apparatus 1 according to the embodiment are described below.

FIG. 5(a) is a perspective view showing an example of a mobile phone. In FIG. 5(a), numeral 1000 denotes a mobile phone body, and numeral 1001 denotes a display using the organic EL apparatus 1.

FIG. 5(b) is a perspective view showing an example of a watch-type electronic instrument. In FIG. 5 (b), numeral 1100 denotes a watch body, and numeral 1101 denotes a display using the organic EL apparatus 1.

FIG. 5(c) is a perspective view showing an example of a portable information processing apparatus, such as a word processor and personal computer, for example. In FIG. 5(c), numeral 1200 denotes the information processing apparatus, numeral 1202 denotes an input unit such as a keyboard, numeral 1204 denotes an information-processing apparatus body, and numeral 1206 denotes a display using the organic EL apparatus 1.

The electronic instruments shown in FIGS. 5(a) to 5(c) have the organic EL apparatuses 1 according to the embodiment, enabling an electronic instrument having an organic EL display with excellent visibility and a long life span to be provided without or substantially without reducing the light-emitting strength.

In addition, the technical scope of the present invention is not limited to the embodiments described above, and various modifications may be made within the spirit of the present invention.

For example, according to the embodiment describe above, as the arrangement of the light-emitting element 3, from the substrate 2, the anode 5, the hole transporting layer 6, the organic light-emitting layer 8, the electron transporting layer 9, and the cathode 10 are sequentially arranged in this order. However, the invention is not limited to this arrangement, and the reverse-order arrangement may be adopted, for example. Also, the polarization beam splitter 4 is constituted by the sealing layer. Alternatively, for example, a panel having cholesteric liquid crystal enclosed in cells may also be used. In addition, the specific materials shown in the embodiment are only examples, and appropriate alternation may be possible. According to the embodiment, the light-emitting element including an organic workpiece is exemplified. Alternatively, the present invention may be widely applicable to a light-emitting type display having mirror feeling.

In addition to the embodiment described above, an arrangement may be adopted in that a wavelength correcting layer having the same function as that of the wavelength correcting layer 21 is added to between the polarizing plate 22 and the polarization beam splitter 4. In this case, the polarizing plate 22 and the polarization beam splitter 4 may preferably be arranged so that the polarization axes intersect each other at an angle of 45°.

[Advantages]

As described above, according to the present invention, the visibility can be enhanced by preventing or substantially preventing a reduction in the light emitting strength while outside light reflection is reduced or suppressed. The present invention also reduces or suppresses defects due to the element degradation, which are instability with time and a short life span while enhancing manufacturing efficiency. Then, according to the present invention, an electro-optical apparatus with a long life span, excellent visibility and manufacturing efficiency can be obtained.

What is claimed is:

1. An electro-optical apparatus, comprising:
    a substrate;
    a light-emitting element formed above the substrate;
    a wavelength correcting unit arranged above the light-emitting element with the light-emitting element located between the substrate and the wavelength correcting unit;
    a planar polarization beam splitter arranged such that at least some of the light from the light-emitting element passes through the planar polarization beam splitter, the planar polarization beam splitter including
        a sealing layer comprising alternative layers of organic and inorganic materials, and the alternative layers including at least two inorganic materials and an organic material formed between the inorganic materials; and
    a polarizing plate arranged above the planar polarization beam splitter.

2. The electro-optical apparatus according to claim 1, the planar polarization beam splitter includes the sealing layer to hermetically seal the light-emitting element.

3. The electro-optical apparatus according to claim 2, the planar polarization beam splitter being formed of a plurality of alternating inorganic compound layers and organic compound layers, one of the inorganic compound layers having an isotropic refractive index and having a rubbing direction in a predetermined direction, and one of the organic compound layers having an anisotropic refractive index.

4. The electro-optical apparatus according to claim 3, the inorganic compound layers having rubbing directions that are substantially the same.

5. The electro-optical apparatus according to claim 1, on a surface of the polarizing plate, at least one of nonglaring treatment and reflection-reducing treatment being performed.

6. An electronic instrument, comprising:
    the electro-optical apparatus according to claim 1.

7. A manufacturing method of an electro-optical apparatus with a light-emitting element formed above a substrate, comprising:
    arranging a wavelength correcting unit above the light-emitting element with the light-emitting element located between the substrate and the wavelength correcting unit;
    arranging a planar polarization beam splitter such that at least some of the light from the light-emitting element passes through the planar polarization beam splitter, the planar polarization beam splitter including
        a sealing layer comprising alternative layers of organic and inorganic materials, and the alternative layers including at least two inorganic materials and an organic material; and
    arranging a polarizing plate above the planar polarization beam splitter.

8. The manufacturing method according to claim 7, wherein the sealing layer hermetically seals the light-emitting element with the planar polarization beam splitter.

9. The manufacturing method according to claim 8, the forming the sealing layer including forming a plurality of layers by alternately laying up an inorganic compound layer having an isotropic refractive index, on which a rubbing treatment is performed in a predetermined direction, and an organic compound layer having an anisotropic refractive index.

10. The manufacturing method according to claim 9, further including forming the planar polarization beam splitter by laying up layers, each having the isotropic refractive index, so that the rubbing directions are substantially the same.

11. The manufacturing method according to claim 7, further including performing at least one of nonglaring treatment and reflection-reducing treatment on a surface of the polarizing plate.

12. The electro-optical apparatus according to claim 1,
    the wavelength correcting unit arranged directly on the light-emitting element;
    the planar polarization beam splitter arranged directly on the wavelength correcting unit; and
    the polarizing plate arranged directly on the planar polarization beam splitter.

13. The manufacturing method according to claim 7, further including
    arranging the planar polarization beam splitter comprising arranging the planar polarization beam splitter directly on the wavelength correcting unit; and arranging the polarizing plate comprising arranging the polarizing plate directly on the planar polarization beam splitter.

14. An electro-optical apparatus, comprising:
a light-emitting element;
a planar polarization beam splitter arranged such that at least some of the light from the light-emitting element passes through the planar polarization beam splitter,
the planar polarization beam splitter including alternating layers of a plurality of organic layers and a plurality of inorganic layers;
a wavelength correcting unit arranged between the light-emitting element and the planar polarization beam splitter; and
a polarizing plate arranged such that at least some of the light from the light-emitting element passes through the polarizing plate,
at least two of the plurality of inorganic layers each having a corresponding rubbing direction,
the plurality of organic layers comprising a transmissive material having an anisotropic refractive index in a specific direction,
the plurality of inorganic layers comprising a transmissive material having gas-barrier properties, and
the planar polarization beam splitter hermetically sealing the light-emitting element.

* * * * *